United States Patent [19]

Van Pelt et al.

[11] 4,394,438
[45] Jul. 19, 1983

[54] METHOD OF MANUFACTURING AN OPTICALLY READABLE INFORMATION CARRIER USING DEEP U.V. RADIATION

[75] Inventors: Pieter Van Pelt, Sunnyvale, Calif.; Gerardus J. M. Lippits, Eindhoven, Netherlands

[73] Assignee: U.S. Philips Corporation, New York, N.Y.

[21] Appl. No.: 291,703

[22] Filed: Aug. 10, 1981

[30] Foreign Application Priority Data

Dec. 22, 1980 [NL] Netherlands .................. 8006947

[51] Int. Cl.³ .................. G03C 5/04; G01D 15/02; G01D 15/24
[52] U.S. Cl. .................. 430/321; 430/326; 430/396; 346/135.1; 346/77 E
[58] Field of Search .................. 430/321, 326, 396; 346/135.1, 77 E

[56] References Cited

U.S. PATENT DOCUMENTS

| | | | |
|---|---|---|---|
| 3,535,137 | 10/1970 | Haller et al. | 156/659.1 |
| 4,078,098 | 3/1978 | Cortellino | 430/326 |
| 4,102,683 | 7/1978 | DiPiazza | 430/396 |
| 4,297,433 | 10/1981 | Tsuda et al. | 430/326 |

*Primary Examiner*—Richard L. Schilling
*Attorney, Agent, or Firm*—Norman N. Spain

[57] ABSTRACT

A method of manufacturing an optically readable information carrier in which a substrate 1 which is provided on at least one surface with a material which is sensitive to deep ultraviolet light having a wavelength from 190–300 nm, is exposed to deep ultraviolet light via a contact mask 2 which on one side has a layer 4 of a material which is not permeable to deep ultraviolet light in which an information track 5, 6 has been provided, after which the exposed plate is developed and if desired is provided with a reflection layer.

3 Claims, 2 Drawing Figures

METHOD OF MANUFACTURING AN OPTICALLY READABLE INFORMATION CARRIER USING DEEP U.V. RADIATION

The invention relates to a method of manufacturing an optically readable information carrier in which a substrate plate is provided on one side or on both sides with an optical structure which comprises an information track of information areas situated alternately at a higher and at a lower level.

The information carrier may comprise video or audio information and is also termed VLP (video long play) disk or ALP (Audio long play) disk. The substrate plate usually comprises a reflection layer overlying the optical structure, in particular a vapour-deposited metal layer. The optical structure is read in a reflective mode by means of radiation, on the basis of phase differences occurring between the forward and the reflected reading beam. A suitable reading beam is a laser light beam, for example, derived from an AlGaAs laser having an emission wavelength of 810–840 nm. The optical structure is built up from very fine structural details in which the information areas have extremely small dimensions. The longitudinal dimensions of the information areas vary in accordance with the stored information and are approximately 0.3–3 μm. The difference in height between the areas corresponds to a quarter wavelength of the reading laser light and is, for example, 0.1 to 0.2 μm.

The above-described method is known inter alia from Netherlands Patent Application No. 7611395 (PHN 8576) in the name of Applicants. According to the known process the surface of a metal matrix, for example a nickel matrix, in which an information track is provided, is covered with a layer of a liquid lacquer which can be polymerized under the influence of light, for example UV light, a transparent substrate plate, for example manufactured from polymethylmethacrylate, is then laid on the lacquer layer, the lacquer layer is cured by radiation via the transparent substrate, and the substrate together with the lacquer layer which is connected thereto and in which the information track is copied are finally removed from the matrix surface.

This known process leads to good results but the process technically has a few disadvantages. For example, detrition and/or pollution of the matrix surface may occur so that a number of manufactured information carrier do not satisfy the requirements imposed. The matrix must in that case be replaced or carefully cleaned as to remains of cured lacquer must be removed. Furthermore, the process steps of providing the lacquer layer and placing the transparent substrate plate are rather cumbersome. The lacquer layer must be provided uniformly, that is to say in a uniform thickness, while furthermore no inclusion of air bubbles may take place between lacquer layer and substrate plate. Another disadvantage is that information cannot be provided simultaneously on two sides. Furthermore, it should be taken into account that upon curing, that is polymerization of the lacquer, shrinkage occurs so that the information track copied in the lacquer layer may show small differences with respect to the information track present in the matrix surface.

The invention relates to a process which differs entirely from the current methods of manufacturing the above-mentioned information carriers. The new process of manufacturing information carriers is based on a lithographic process which is known per se for the manufacture of semiconductor elements such as chips. The above given disadvantages of the known methods of manufacturing information disks are avoided by means of the process according to the invention.

SUMMARY OF THE INVENTION

The invention relates more in particular to a method of manufacturing an information carrier as mentioned in the opening paragraph and is characterized in that a substrate plate which consists entirely of or at least comprises on one of the two surfaces a material which is sensitive to deep ultraviolet light, is exposed to deep ultraviolet light according to a lithographic process via a mask which is brought into contact with the surface of the substrate plate comprising the photosensitive material, said mask comprising a supporting plate which is transparent to deep ultraviolet light, said supporting plate being provided on the side facing the substrate with a layer of a material which is not permeable to deep ultraviolet light, in which layer a pattern is provided which corresponds to the optical structure to be provided in the substrate plate, and the substrate plate exposed via the mask is then treated with a developer in which the exposed parts of the photosensitive material are dissolved and an information track is formed.

DETAILED DESCRIPTION OF THE INVENTION

Figure 1:
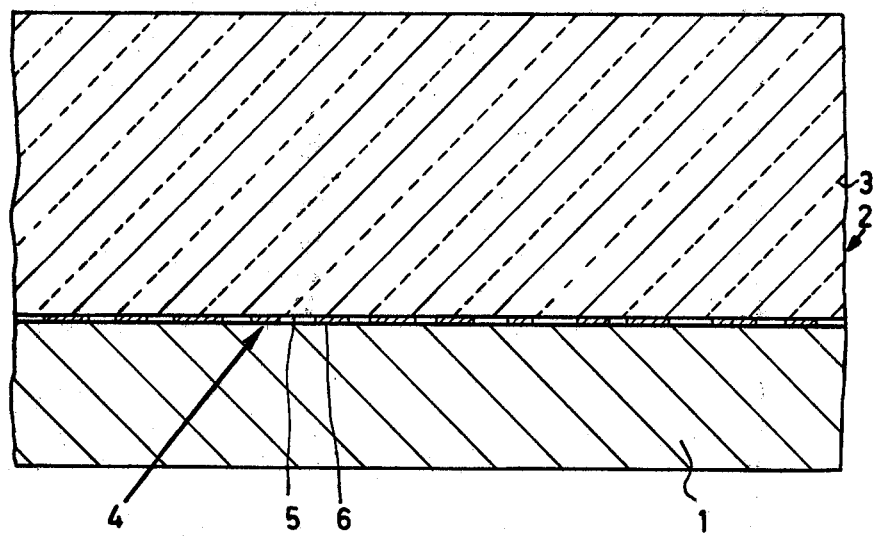

Deep ultraviolet light, hereinafter also referred to by the abbreviation DUV, is to be understood to mean light having a wavelength from 190 to 300 nm. Light having such a wavelength range is produced by special light sources such as high pressure and low pressure mercury lamps which in their light spectra have an emission wavelength of 250 nm. In general gas discharge lamps having a metal vapour plasma of, for example, Zn, Cd or Hg are suitable sources for DUV.

As DUV-light sensitive material preferably a homopolymer or a copolymer of a monomeric compound which corresponds to the formula I

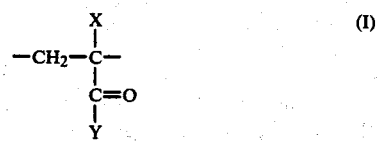
(I)

is used, wherein X is a methyl group, a cyano group or a halogen atom and Y is an alkyl group or alkoxy group having 1–6 carbon atoms which may each be substituted with one or more halogen atoms or with a hydroxy group or a copolymer of a monomeric compound of formula I and a monomeric compound according to formula II below

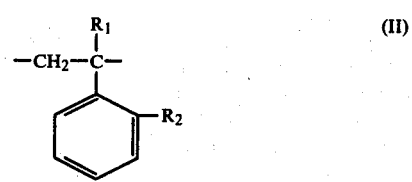
(II)

wherein
$R_1$ is an alkyl group having 1 to 6 carbon atoms and
$R_2$ is a hydrogen atom or an alkyl group having 1 to 6 carbon atoms.

Examples of suitable DUV-light sensitive substances are homopolymers or copolymers of alkylmethacrylates. Copolymers of alkylmethacrylates are to be understood to mean substances which are obtained by copolymerizing mutually different alkylmethacrylates such as ethylmethacrylate and methylmethacrylate. Also readily useful materials are copolymers of alkylmethacrylates with methacrylic acid, methacrylic acid anhydride, α-cyanoalkylmethacrylates or methylalkylketones such as methylisopropylketone and methylisobutylketone as well as polyalkylsulphones and polymethylalkylketones. To the light-sensitive material may be added a sensitizer such as a benzoic acid derivative, for example, p-t.butylbenzoic acid in a quantity of a few percent by weight so as to increase the sensitivity to DUV.

In a favourable embodiment of the method in accordance with the invention a substrate plate is used which is manufactured entirely from polymethylmethacrylate. By this means the light-sensitive material, in this case polymethylmethacrylate, also forms the body of the plate, that is to say gives the plate the desired strength, rigidity and dimensions, such as thickness. As a result of this the manufacturing process of information carriers is considerably simplified which is a significant advantage in particular in series production. Plates of polymethylmethacrylate from which the disk-shaped substrate plates having the desired diametrical dimensions can be cut in a simple manner are commercially available. Examples of suitable plates are those which are marketed as plexiglass by Rohm en Haas and in particular the types Plexiglass 218 and 279. The plates of polymethylmethacrylate are chemically stable products which do not degrade or degrade only slightly under the influence of, for example, sunlight, which is of evident importance for the longer term quality of the information carriers manufactured herefrom, while the sensitivity to DUV is sufficiently large to provide the optical structure mentioned above. After exposing the plate of polymethylmethacrylate to DUV light via the mask and the subsequent development of the exposed plate, the resulting information carrier is ready for use. A further after-treatment is not necessary, apart from the provision of a reflection layer which is required in order to read the optical structure in a reflective mode.

The mask consists of a supporting plate manufactured from DUV transparent material such as quartz which is covered on one side with a thin layer of a material which is not permeable to DUV in which an information pattern is provided. Quite a lot of substances are not permeable to DUV, such as organic materials, for example, synthetic resins and dyes or chalcogenide mixtures. All such substances are in principle suitable to be used as DUV-absorbing substances in the mask. Preferred absorbing substance are those which have a high rigidity and resistance to detrition and in which the desired pattern can be provided in a simple manner. Suitable and preferably used materials are metals and metal oxides such as chromium and iron oxides. The layer thickness is small and amounts, for example, to 100 nm. In a favourable embodiment of the method according to the invention a mask is used which comprises a supporting plate which is manufactured from quartz and which has on one side a layer of metal or metal oxide in which the pattern is etched.

The provided pattern consists of an information track of information areas which alternately are covered and are not covered with the DUV-absorbing material. For the manufacture of information carriers the mask is contacted with the supporting plate particularly in a manner so that the surface of the mask which has the DUV-absorbing coating layer engages the surface of the substrate plate which comprises the DUV-sensitive material. A method of causing good contacting can be achieved through the use of, for example, a compressed air cassette. Upon exposure through the mask, the DUV-sensitive material of the substrate plate which is present below the "open" information areas of the mask, that is to say below the areas which are not covered by the DUV-absorbing material, will be decomposed chemically. The polymer chains are broken down so that in the subsequent developing step they can dissolve in the developer used. The result is that an information track is formed in the DUV-sensitive surface of the substrate plate which corresponds to that of the mask on the understanding that the open information areas of the mask correspond to the information areas of lower level in the substrate plate and that the closed information areas of the mask, hence the areas covered with the DUV-non-permeable material, correspond to the information areas of a higher level of the substrate plate. The corresponding information areas of mask and substrate plate have the same longitudinal and width dimensions. The difference in height between the information areas of the substrate plate depends on the sensitivity of DUV-sensitive material used and of course on the intensity of the DUV used and the exposure time. By a suitable choice of these factors a desired difference in height of, for example, 0.1 to 0.2 μm can be obtained very accurately.

Good results are achieved with a method in accordance with the invention in which a mask is provided on one or both surfaces of a substrate plate manufactured from polymethylacrylate, said mask comprising a supporting plate of quartz and a layer of metal or metal oxide provided on the side of the substrate plate, in which layer a pattern is etched, the substrate plate is exposed via the mask, for 1 to 15 minutes, to deep ultraviolet light having a wavelength from 200–240 nm originating from a gas discharge lamp having a metal vapour plasma and a light intensity of 150–1500 mJ/cm$^2$ on the substrate plate, the mask is removed and the exposed substrate plate is treated for at most a few minutes with a developer which comprises a mixture of methylisobutylketone and isopropanol or a mixture of isopropanol and water.

The said developer is a rather inert developer. Also useful are the slightly more rapid developers such as methylcellosolve acetate, methylisobutylketone or xylene. When a rapid developer is used there is a better chance that the non-exposed parts of the substrate plate are also decomposed slightly. The more inert acting developers are therefore to be preferred.

The mask used in the method in accordance with the invention can be manufactured in any usual manner. For this purpose a quartz supporting plate having a diameter of for example 15 cm and a thickness of a few mm for example 5 mm is provided on one side with a layer of metal, in particular chromium, in a thickness of approximately 100 nm which in turn is covered with a positive photolacquer in a thickness of 150–400 nm. The layer of photolacquer is exposed to laser light modulated in accordance with the information to be recorded. The modulation is based on intensity variations of the laser light in which there is modulated from an intensity which is insufficient to decompose the layer of photolacquer up to an intensity which is sufficiently high to decompose the photolacquer throughout its thickness. The exposed parts of the layer of photolacquer are removed by means of a developer. The released parts of the chromium layer are etched away and finally the remainders of the layer of photolacquer are removed.

Figure 2:
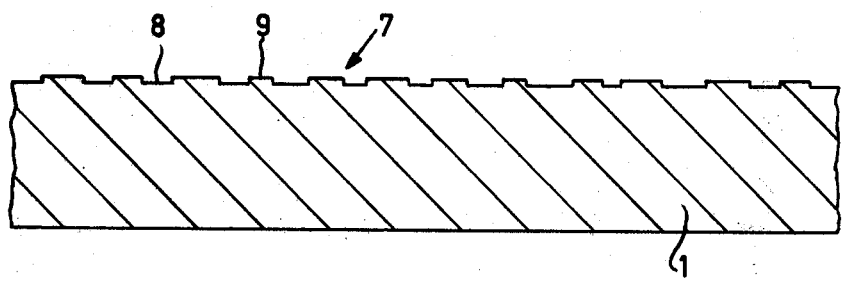

The invention will now be described in greater detail with reference to the following example and the drawing, in which:

FIG. 1 is a cross-sectional view of a substrate plate used in the method on which a mask is placed, FIG. 2 is a cross-sectional view of a resulting information carrier.

EXAMPLE

A mask 2 is placed on a disk 1 of moulded polymethylmethacrylate (PMMA) having a diameter of 5 cm and a thickness of 1.3 mm, which mask comprises a quartz supporting plate 3 in a thickness of 4 mm which on the side of the disk 1 is provided with a layer 4 of $Fe_2O_3$ in which an information track has been etched. The information track comprises "open" information areas 5 not covered with $Fe_2O_3$ alternated by information areas 6 covered by $Fe_2O_3$. The longitudinal dimensions of areas 5 and 6 vary in accordance with the stored information and are from 0.3 to 3 $\mu$m. The width dimension of each area is 0.3 mm. The assembly is placed in a compressed air cassette not shown as a result of which an optimum contact of disk 1 with mask 2 is possible. The disk 1 is exposed via mask 2 to deep ultraviolet light originating from a 75 W gas discharge lamp (type Philips Special Purpose No. 93146) placed at a distance of 12 cm from the mask 2. The exposure time was 10 minutes. After exposure the mask 2 was removed and the disk 1 was immersed in an isopropanol-water (10:1) mixture for 2 minutes. The disk 1 was rinsed with distilled water and blown to dryness with nitrogen gas. The resulting information carrier is shown in FIG. 2. The information track 7 of the disk 1 comprises information areas 8 situated at a lower level and alternated by information areas 9 situated at a higher level. The difference in height between areas 8 and 9 is 0.15 $\mu$m. The longitudinal and width dimensions of areas 8 correspond accurately with those of the areas 5 of mask 2, while the longitudinal and width dimensions of areas 9 of disk 1 correspond exactly to those of areas 6 of mask 2.

Finally the disk 1 is provided on the side of the information track 7 with a vapour-deposited Al-layer in a thickness of 60 nm which is not shown in the figure.

It is to be noted that the disk 1 may also be provided with a mask on both surfaces and then be exposed simultaneously on both sides via the respective masks so that an information carrier having an optical structure on each side is obtained.

What is claimed is:

1. A method of manufacturing an optically readable information carrier in which a substrate plate is provided on one side or on both sides with an optical structure which structure comprises an information track of information areas situated alternatively at a higher and a lower level, characterized in that a substrate plate which is manufactured entirely from polymethylmethacrylate is exposed, according to a lithographic process, to deep ultraviolet light through a mask which is brought into contact with a surface of said substrate plate, said mask comprising a supporting plate which is transparent to deep ultraviolet light, said supporting plate being provided on the side facing the substrate with a layer of material impermeable to deep ultraviolet light, in which layer a pattern is provided corresponding to the optical structure to be provided in the substrate plate and the substrate plate thus exposed through said mask is then treated with a developer capable of disolving the exposed parts of said polymethylmethacrylate thereby dissolving the exposed parts of said polymethylmethylacrylate and forming an information track on said substrate plate.

2. A method as claimed in claim 1, characterized in that a mask is used which comprises a supporting plate manufactured from quartz which is provided on one side with a layer of metal or metal oxide in which the pattern has been etched.

3. A method as claimed in claim 1, characterized in that a mask is provided on one or both surfaces of a substrate plate manufactured from polymethylmethacrylate, said mask comprising a supporting plate of quartz and a layer of metal or metal-oxide provided on the side of the substrate plate in which layer a pattern has been etched, the substrate plate is exposed via the mask for 1-15 minutes to deep ultraviolet light having a wavelength from 200-240 nm originating from a gas discharge lamp having a metal vapour plasma and a light intensity from 150-1500 $mJ/cm^2$ on the substrate plate, the mask is removed and the exposed substrate plate is treated for at most a few minutes with a developer which comprises a mixture of methylisobutylketone and isopropanol or a mixture of isopropanol and water.

* * * * *